United States Patent [19]

Chen

[11] Patent Number: 6,041,090
[45] Date of Patent: Mar. 21, 2000

[54] DATA SAMPLING AND RECOVER IN A PHASE-LOCKED LOOP (PLL)

[75] Inventor: Dao-Long Chen, Fort Collins, Colo.

[73] Assignee: LSI Logic Corporation, Milpitas, Calif.

[21] Appl. No.: 08/962,890

[22] Filed: Nov. 14, 1997

Related U.S. Application Data

[63] Continuation of application No. 08/513,055, Aug. 9, 1995, abandoned.

[51] Int. Cl.[7] ........................................................ H03D 3/24
[52] U.S. Cl. .......................... 375/376; 327/148; 327/149; 327/157; 327/158; 331/12; 331/60
[58] Field of Search ..................................... 375/371, 372, 375/373, 374, 375, 376; 327/147–150, 152, 156–159; 331/1 A, 11, 12, 25, 46, 56, 57, 60, 61, 152, 161, 162

[56] References Cited

U.S. PATENT DOCUMENTS

| | | | |
|---|---|---|---|
| 4,151,485 | 4/1979 | LaFratta | 375/376 |
| 4,573,173 | 2/1986 | Yoshida | 375/371 |
| 4,672,639 | 6/1987 | Tanabe et al. | 375/371 |
| 4,970,609 | 11/1990 | Cunningham | 360/51 |
| 5,161,173 | 11/1992 | Nordby | 375/119 |
| 5,212,601 | 5/1993 | Wilson | 360/51 |
| 5,230,013 | 7/1993 | Hanke et al. | 375/119 |
| 5,301,196 | 4/1994 | Ewen et al. | 370/105.2 |
| 5,341,405 | 8/1994 | Mallard, Jr. | 375/376 |
| 5,367,542 | 11/1994 | Guo | 375/110 |
| 5,399,995 | 3/1995 | Kardontchik et al. | 331/25 |
| 5,408,200 | 4/1995 | Buhler | 331/11 |
| 5,483,558 | 1/1996 | Leon et al. | 375/376 |
| 5,521,948 | 5/1996 | Takeuchi | 375/376 |
| 5,574,756 | 11/1996 | Jeong | 375/376 |

FOREIGN PATENT DOCUMENTS

| | | | |
|---|---|---|---|
| 0477582 | 4/1992 | European Pat. Off. | H03M 9/00 |
| 9514340 | 5/1995 | WIPO | H04L 7/033 |

OTHER PUBLICATIONS

Very High Speed Continuous Sampling Using Matched Delays; Electronics Letters; S. M. Clements et al.; Mar. 17, 1994; vol. 30, No. 6, ISSN 0013–5194; pp. 463–465.

Designing On–Chip Clock Generators; Dao–Long Chen; Circuits & Devices; Jul. 1992; pp. 32–36.

Multi–Gigabit–Per–Second Silicon Bipolar IC's for Future Optical–Fiber Transmission Systems; Hans–Martin Rein; IEEE Journal of Solid–State Circuits; Jun. 1988; pp. 664–675.

Electronic Communication Techniques; Paul H. Young; FM Transmitter Circuits; pp. 343, 345, 721, 722–723.

Principles of CMOS VLSI Design A systems Perspective; Neil H.E. Weste; Kamran Eshraghian; CMOS Circuit & Logic Design; pp. 334–336 & pp. 685–689.

*Primary Examiner*—Don N. Vo

[57] ABSTRACT

A circuit for detecting whether a reference clock signal, one of n phase-shifted adjacent clock signals, of a phase-locked loop (PLL) is aligned with incoming data, comprising: a data sampler for sampling bits of the incoming data with each of the adjacent clock signals, wherein a first of the adjacent clock signals clocks bits 0, 0+n, 0+2n, . . . , and a second of the adjacent clock signals clocks bits 1, 1+n, 1+2n, . . . . Also, a PLL circuit for recovering a clock signal from incoming data, comprising: a clock generator for generating an odd number, n, of phase-shifted adjacent clock signals; a data sampler for sampling the incoming data; a first pair of outputs from the sampler, for use in a phase detector (along with a reference clock of the adjacent clock signals and the incoming data), capable of producing an adjustment output. Another characterization is a method for recovering data in a PLL comprising the steps of: generating n phase-shifted adjacent clock signals for sampling bits incoming to the PLL; wherein a first of the adjacent clock signals clocks bits 0, 0+n, 0+2n, . . . , and a second of the adjacent clock signals clocks bits 1, 1+n, 1+2n, . . . . Similarly, a third of the adjacent clock signals can be used to clock bits 2, 2+n, 2+2n, . . . , as well as a fourth and fifth of the adjacent clock signals.

25 Claims, 6 Drawing Sheets

DATA SAMPLING AND RECOVER IN A PHASE-LOCKED LOOP (PLL)

This is a continuation of application Ser. No. 08/513,055 filed on Aug. 9, 1995 now abandoned.

BACKGROUND OF THE INVENTION

In general, the present invention relates to data recovery in phase-locked loop (PLL)-type circuits as well as the use of PLLs for generating, aligning, and recovering data such as clock signals. More particularly, this invention relates to: an improved circuit for detecting whether a reference clock signal of a PLL is aligned with incoming data; an improved PLL circuit for recovering a clock signal from incoming data; and an improved method for recovering data in a PLL.

Background information describing and illustrating PLLs currently in use for clock generation and synchronization can be found in an 1992 IEEE publication *Circuit & Devices* article entitled *Designing On-Chip Clock Generators* (pp. 32–36), authored by applicant Dr. Dao-Long Chen, as well as two reference texts: *Electronic Communication Techniques*, third edition, by Paul H. Young (see esp. all of chapter 10, and pp. 721–723); and *Principles of CMOS VLSI Design, A Systems Perspective*, second edition, by Neil H. E. Weste and Kamran Eshraghian (see esp. pp. 334–336, and pp. 685–689).

PLL data recovery circuits are useful for recovering data and/or clock signals after transmission over a distance using, for example, fiber-optic (glass) cables. One recent PLL-type combination clock recovery circuit and demultiplexer circuit has been described (U.S. Pat. No. 5,301,196) to operate at either half, or one-quarter, the data rate of a received data signal. The combination of circuits described is preferably designed for "the logic family . . . [of] Gallium Arsenide (GaAs) MESFET differential current switched logic". The circuit combination includes a ring oscillator for generating either two phase-shifted clocks (0° and 90° for the half-speed circuit), or four phase-shifted clocks (0°, 45°, 90°, and 135° for the one-quarter speed circuit). The received data signal is used to edge-trigger either two (in the half-speed circuit), or four (in the one-quarter speed circuit) flip-flops to sample, respectively, either the two clocks (0° and 90°), or four clocks (0°, 45°, 90°, and 135°). The outputs of either the two, or four, flip-flops are then fed into an exclusive-OR gate, or a parity generator which has been connected in series with a loop filter and the ring oscillator.

PLL circuits used in today's high frequency systems are typically made using Silicon (Si) bipolar or GaAs (as preferred in the half- and quarter-speed circuits described above) integrated circuit technology. These PLL technologies are very limited in use—either due to high power consumption or high manufacturing cost. It is well understood that the manufacturing cost and/or power dissipation in MOS is generally lower than in comparable Si bipolar or GaAs circuits. These, among other reasons, make it desirable to build PLLs for high-performance communications systems using CMOS technology. However, building PLL components out of CMOS that can reliably operate at such very high data rates (for example, at or in excess of 1-Gb/sec), has been beyond current CMOS technology capabilities. The new PLL circuits and new method described herein make it possible to use current CMOS fabrication technology (although not limited thereto) to build PLL circuits for clock generation, alignment with incoming data, and recovery, as well as for data sampling and recovery.

SUMMARY OF THE INVENTION

It is a primary object of this invention to provide a method for recovering data in a phase-locked loop (PLL), that can be implemented using CMOS technology for high-speed serial data communication systems. It is also an object of this invention to provide a circuit, for use in communication systems, capable of detecting whether a reference clock signal of a PLL is aligned with data incoming at a higher rate than the PLL's operating frequency, where the reference clock is one of n phase-shifted clock signals.

The advantages of providing an improved method for recovering data in a PLL and improved circuits for detecting whether a reference clock of a PLL is aligned with incoming data, as described herein, are as follows: (a) The clock generator and phase detection components of the PLL need not operate at the same high-speed as the incoming data; (b) By reducing the speed at which the PLL circuit components operate, integrated circuit technology typically reserved for lower speed circuits, can be used to implement the improved method and circuits; (c) Also, by reducing the speed at which PLL components must operate, power consumption of the implemented improved method and circuits will be reduced; (d) The reduced PLL operation frequency allows CMOS technology to be used, which can lower the overall cost of the integrated circuit ("chip") fabricated to implement the improved method and circuits; (e) More particularly, since the power dissipation in MOS is generally lower than in comparable bipolar circuits, using CMOS technology to implement the improved method and circuits will lower power consumption of the PLL; and (f) Versatility—either bipolar or MOS technology can be accommodated.

Briefly described, the invention includes a circuit for detecting whether a reference clock signal, one of n phase-shifted adjacent clock signals, of a phase-locked loop (PLL) is aligned with incoming data, comprising: a data sampler for sampling bits of the incoming data with each of the adjacent clock signals, wherein a first of the adjacent clock signals clocks bits $0, 0+n, 0+2n, \ldots$, and a second of the adjacent clock signals clocks bits $1, 1+n, 1+2n, \ldots$. The circuit can include a first phase detector that operates on a first pair of outputs from the data sampler, and second phase detector that operates on a second pair of outputs from the data sampler, and so on. A phase adjustment output can be provided, as necessary, to a charge pump connected in series with a clock generator. Also characterized is a PLL circuit for recovering a clock signal from incoming data having a clock generator for generating an odd number, n, of phase-shifted adjacent clock signals, and a data sampler for sampling the incoming data. A first pair of outputs from the data sampler is used in a phase detector (along with a reference clock of the adjacent clock signals and the incoming data) for producing a phase adjustment output.

The invention also includes a method for recovering data in a PLL comprising the steps of generating n phase-shifted adjacent clock signals for sampling bits incoming to the PLL, so that a first of the adjacent clock signals clocks bits $0, 0+n, 0+2n, \ldots$, and a second of the adjacent clock signals clocks bits $1, 1+n, 1+2n, \ldots$. Additionally, a third of the adjacent clock signals can be used to clock bits $2, 2+n, 2+2n, \ldots$. Likewise, a fourth clock can be used to clock incoming bits $3, 3+n, 3+2n, \ldots$, and a fifth clock signal can be used to clock incoming bits $4, 4+n, 4+2n, \ldots$.

BRIEF DESCRIPTION OF THE DRAWINGS

The invention will be more particularly described by referencing the accompanying drawings of the preferred embodiments, in which like numerals designate like parts.

FIGS. 6 & 7 are timing diagrams illustrating waveforms for two example conditions—FIG. 6 shows CLOCK4 lagging data 21 and FIG. 7 shows CLOCK4 leading the data.

DETAILED DESCRIPTION OF THE PREFERRED EMBODIMENTS

Figure 1:
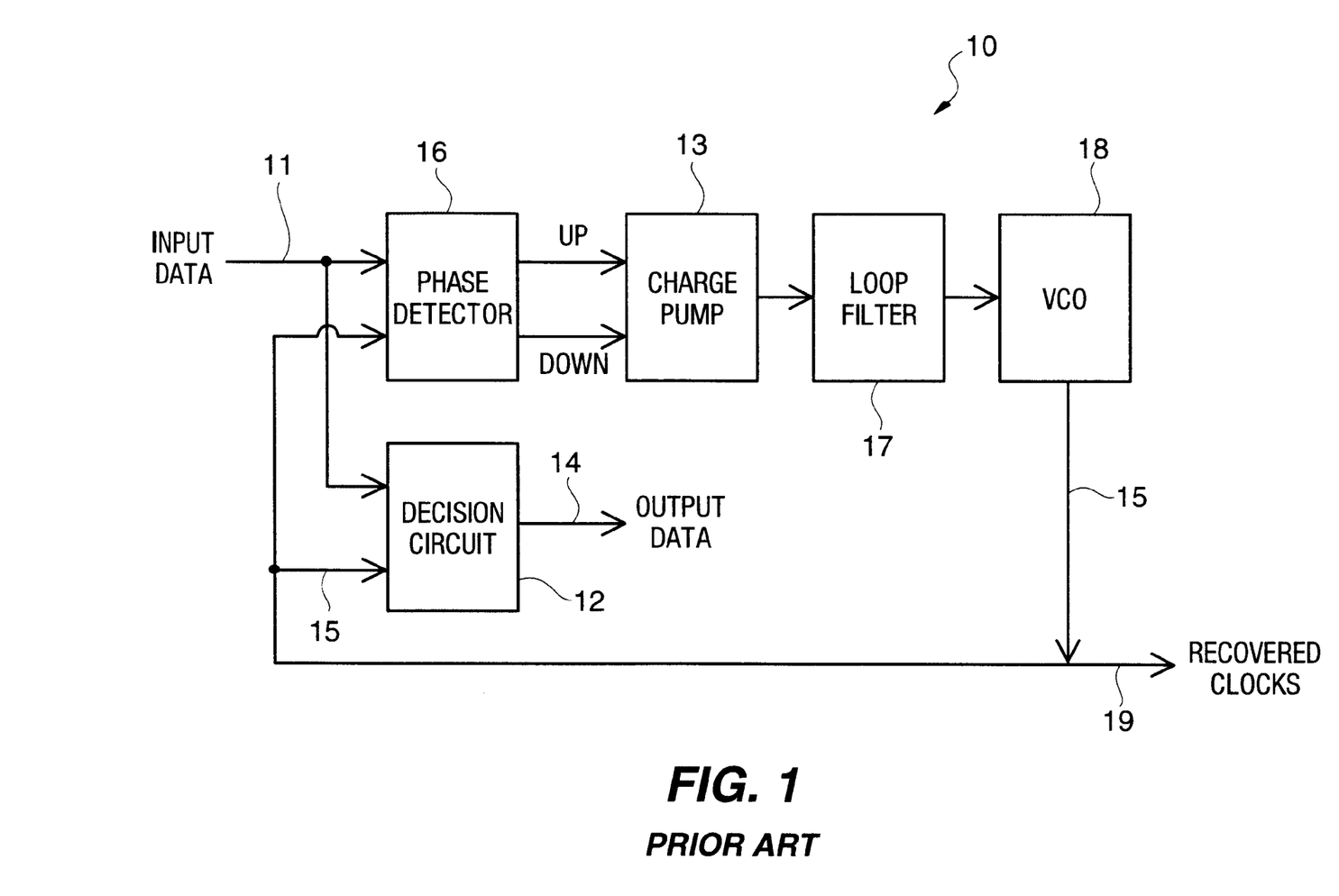
FIG. 1 is a block diagram of a known simple PLL circuit 10 that uses a single clock pulse with a decision circuit 12, to export data from the PLL (along arrow 14).

Shown at 10 of FIG. 1 is a known simple PLL circuit (see IEEE Journal of Solid State Circuits, Vol. 23, No. 3, June 1988 *Multi-Gigabit-Per-Second Silicon Bipolar IC's for Future Optical-Fiber Transmission Systems*, esp. FIGS. 1, 19, and 25) uses a single clock pulse 15 generated by Voltage-Controlled Oscillator (VCO) 18, and a decision circuit 12 (which could be a master-slave D flip flop), to export data from the PLL (along arrow 14) for use, elsewhere, in a computer system. An integrated circuit component operating as a phase detector 16 is used, here, to send an output to charge pump 13 for charging VCO 18 either "up" or "down", as required. This allows for phase correction of the clock signal 15 (generated by VCO 18) to take place.

Figure 2:
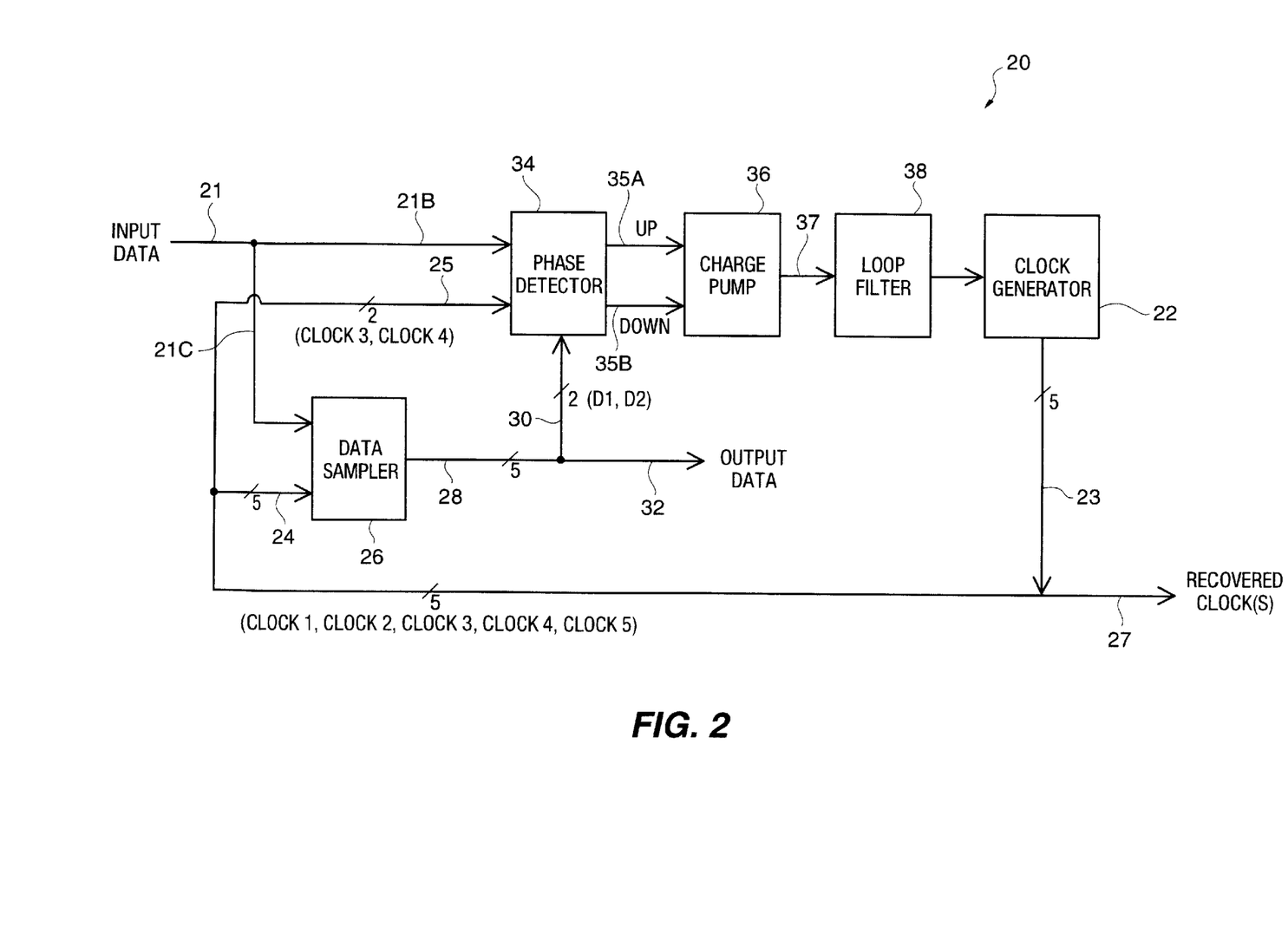
FIG. 2 is a schematic diagram illustrating a preferred implementation of the invention using, in this example, five adjacent clocks (labeled CLOCK1–CLOCK5).

As can be readily seen in FIG. 2, the improved PLL circuit 20 has a clock generator 22 for generating, in this case, five phase-shifted adjacent clock signals 23 (as shown, also, in FIG. 3) which are fed via 24 into data sampler 26 for sampling bits of incoming data 21 which have entered the sampler along 21c (operation details will be described in connection with FIG. 4). Two of the five clocked outputs 28 (labeled D1 and D2 at 30, also shown in FIGS. 3 and 4) enter phase detector 34 of PLL 20, along with two (CLOCK3, CLOCK4 at 25) of the five clocks 23 and input data (at 21b). The operation of phase detector 34 will be described in more detail in connection with FIG. 5. Phase adjustment outputs 35a and 35b enter charge pump 36 to either speed "up" or "down" the clock generator 22 so that phase adjustments can be made to the clock signals generated for the PLL. A loop filter 38 has been included. Clocked output data is exported along 32 from the PLL for use, elsewhere, in a computer system. Similarly, clock signals (in this example, five) can be exported from the PLL along 27 for use, elsewhere, in a computer system.

The clock generator is preferably a Voltage-Controlled Oscillator capable of generating n phase-shifted adjacent clock signals (or "clocks"). The two reference texts cited earlier, *Electronic Communication Techniques* and *Principles of CMOS VLSI Design, A Systems Perspective*, as well as the *Circuits & Devices* article *Designing On-Chip Clock Generators* which is incorporated herein by reference, describe various types of available VCOs and their design considerations. Preferably, a multivibrator or ring oscillator VCO can be used. One popular design is a current-starved ring oscillator, in which the charge and discharge currents are modulated by the control voltage (see, also, FIG. 5 of *Designing On-Chip Clock Generators*). Either of the two known types of charge pumps described in the *Designing On-Chip Clock Generators* article (a current-type or a voltage-type) can be used in the FIG. 2 implementation. As will be described in further detail below, if a current-type charge pump is used and an "up" adjustment is needed to speed up the VCO (because the clocks are lagging behind), a switch is closed for one clock period to send a positively-flowing current from a current-source through the charge pump and into the VCO. And finally, loop filter 38 is preferably a low-pass filter. Using the analogy of water in a reservoir, a low-pass filter behaves like a big reservoir into which the charge pump can pour, or from which the pump can take. The output of the filter, represented by total reservoir water level, controls the frequency of VCO 22. The reservoir needs to be big enough so that any transient disturbances will not significantly change the water level.

Figure 3:
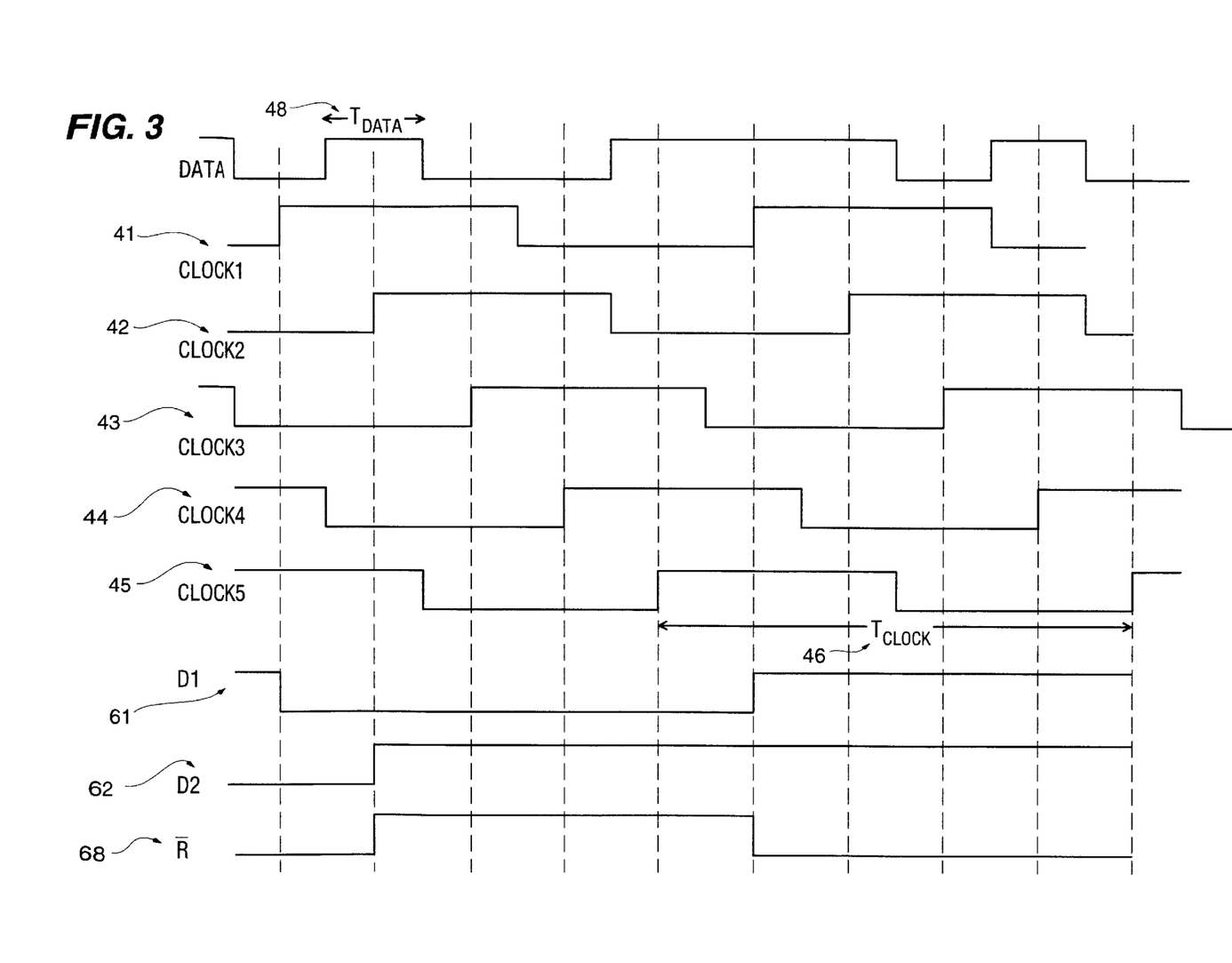
FIG. 3 is a timing diagram illustrating waveforms of example incoming data, five adjacent clocks, two clocked outputs, and the result of an AND operation of the two clocked outputs (one clocked output having, first, been inverted).

Turn, now, to FIG. 3: A five-stage VCO can be built to generate five phase-shifted clocks. Each phase-shifted clock is delayed an amount equal to the incoming data period ("$T_{data}$" at 48). By way of example, in the event incoming data 21 is moving at a rate of 1-Gb/sec, $T_{data}$ equals 1-nsec (i.e., the inverse of 1-Gb/sec). Thus, the frequency of such a five-stage VCO need only be 200 MHZ (i.e., ⅕ of 1 GHz). A 200 MHZ five-stage VCO can be implemented using known CMOS technology. Each of five clock phases generated by VCO 22 is used to sample the incoming data 21 in succession with data sampler 26 (see, also, FIG. 4), so that a total of five incoming bits 21 can be sampled during each 5-nsec clock period ("$T_{clock}$" at 46 in FIG. 3). Thus, an effective sampling rate of 1-Gb/sec, which is also the incoming data rate of this example, can be achieved for phase-locking.

Figure 4:
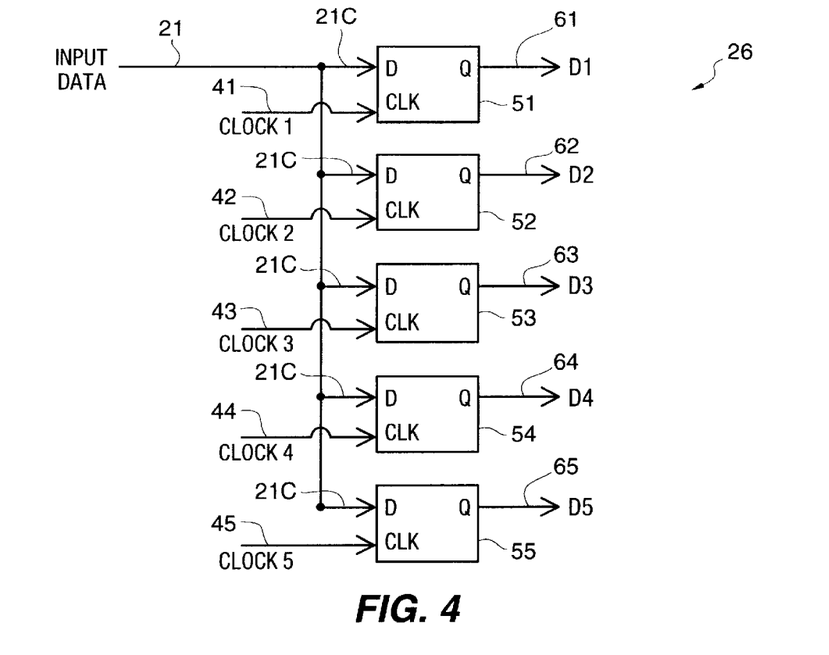
FIG. 4 is a schematic of a preferred data sampler of the invention whereby incoming data is sampled with five adjacent clocks.

FIG. 4 illustrates a preferred data sampler 26 for this five-clock example. Each phase-shifted clock, CLOCK1 through CLOCK5 shown at 41–45, samples successive incoming data bits 21 using a positive-edge triggered D flip-flop (or D latch). Five such D flip-flops are shown at 51–55. Incoming bits enter (along 21c) each flip-flop so that each of the adjacent clocks (41–45) can be used to clock a successive incoming bit. The clocked outputs are shown, respectively, along 61–65.

Figure 5:
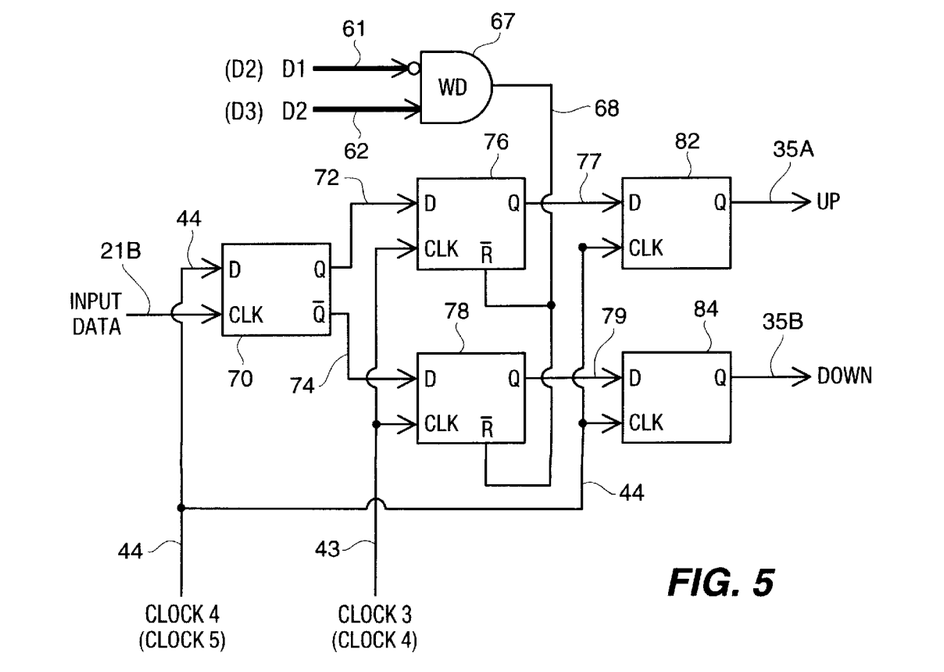
FIG. 5 is a schematic of a preferred phase detector of the invention, which can be implemented with FIGS. 2 and 4, whereby two data sampler outputs are used with a reference CLOCK4 along with the incoming data for phase detection.

To ensure that each incoming data bit is strobed (or sampled) at the center of the bit cells, it is important to control the timing of the phase-shifted clocks. In FIG. 3, the phase-shifted clocks are aligned with incoming data 21: The rising and falling data state changes occur in line with respective falling edges of the clocks. This is not necessarily always the case (as will be discussed in connection with FIGS. 6 and 7). Therefore, a phase detector at 34 in FIG. 5 is used to check alignment of a reference clock (in this example, CLOCK4 at 44) generated by VCO 22. Turn, again, to FIG. 3. The state change of incoming data 21 between the rising edges of CLOCK1 (41) and CLOCK2 (42) is aligned with the falling edge of reference CLOCK4. If CLOCK4 (44) is sampled when incoming data 21 is between the rising edges of CLOCK1 and CLOCK2, it can be determined whether reference CLOCK4 (and, correspondingly, the other phase-shifted clocks) is leading or lagging the incoming data. Once this has been determined, an appropriate adjustment output can be sent to a charge pump 36 and on to VCO 22 (through a loop filter 38) as explained in connection with FIG. 2.

The preferred phase detector 34 in FIG. 5 uses input data 21b to sample (strobe) reference CLOCK4 (44) by operation of a D latch 70. Using a flip-flop 76 into which the output 68 of AND gate 67 is used for reset, CLOCK3 (43) samples the output 72 of D latch 70. Using a second flip-flop 78 into which the output 68 of AND gate 67 is used for reset, CLOCK3 (43) samples the inverted output 74 of D latch 70. Reference CLOCK4 is used to clock the output 77 of flip-flop 76 by operation of D latch 82 to produce an "up" phase adjustment output 35a. Reference CLOCK4 is additionally used to clock the output 79 of flip-flop 78 by operation of a second D latch 84 to produce a "down" phase adjustment output 35b.

Figure 6:
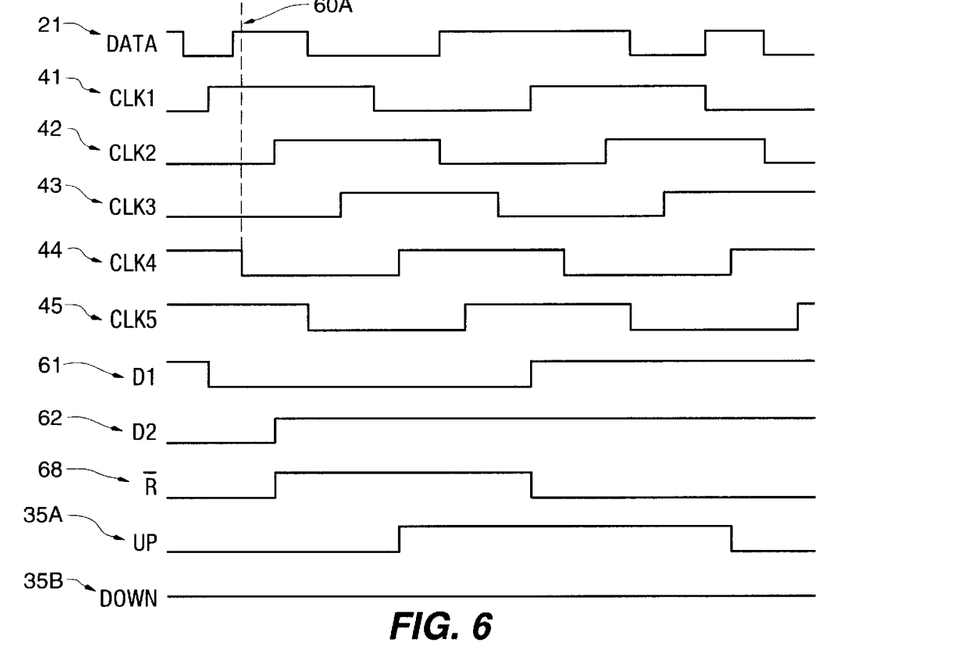

The timing diagrams in FIG. 6 illustrate a situation where strobing CLOCK4 (44) between the rising edges of CLOCK1 (41) and CLOCK2 (42) results in a "1" (or "high") phase adjustment output 35a, indicating that the phase-shifted clocks are lagging (at 60a) the incoming data 21. In this case, the charge pump will pump the VCO "up" for one clock period (represented by $T_{clock}$ at 46 in FIG. 3) to speed up the VCO. If the charge pump is a current-type, a first switch will close for one $T_{clock}$ to send a positive current through the charge pump. If the charge pump is a voltage-type, a first switch will likewise close within the pump to increase the VCO oscillation voltage.

Figure 7:
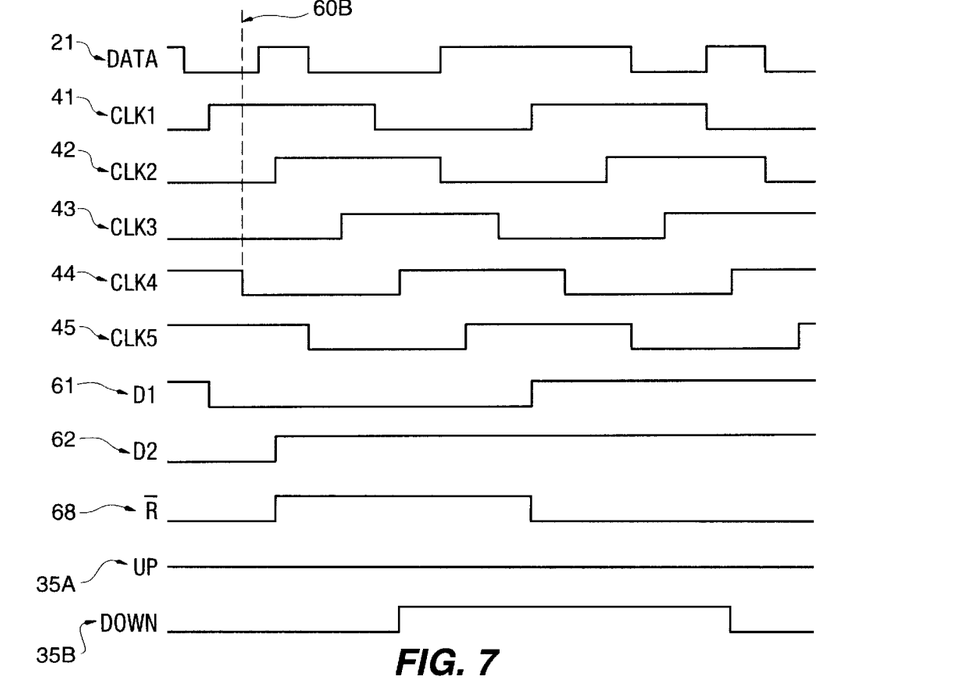

The timing diagrams in FIG. 7 illustrate a situation where strobing CLOCK4 (44) between the rising edges of CLOCK1 (41) and CLOCK2 (42) results in a "0" (or "down") phase adjustment output 35b, indicating that the phase-shifted clocks are leading (at 60b) the incoming data 21. In this case, the charge pump will pump the VCO "down" for one clock period (represented by $T_{clock}$ at 46 in FIG. 3) to slow down the VCO. If the charge pump is a current-type, a second switch in the charge pump will close for one $T_{clock}$ to send an oppositely-flowing current therethrough. If the charge pump is a voltage-type, a second switch will likewise close within the pump to decrease the VCO oscillation voltage.

Figure 8:
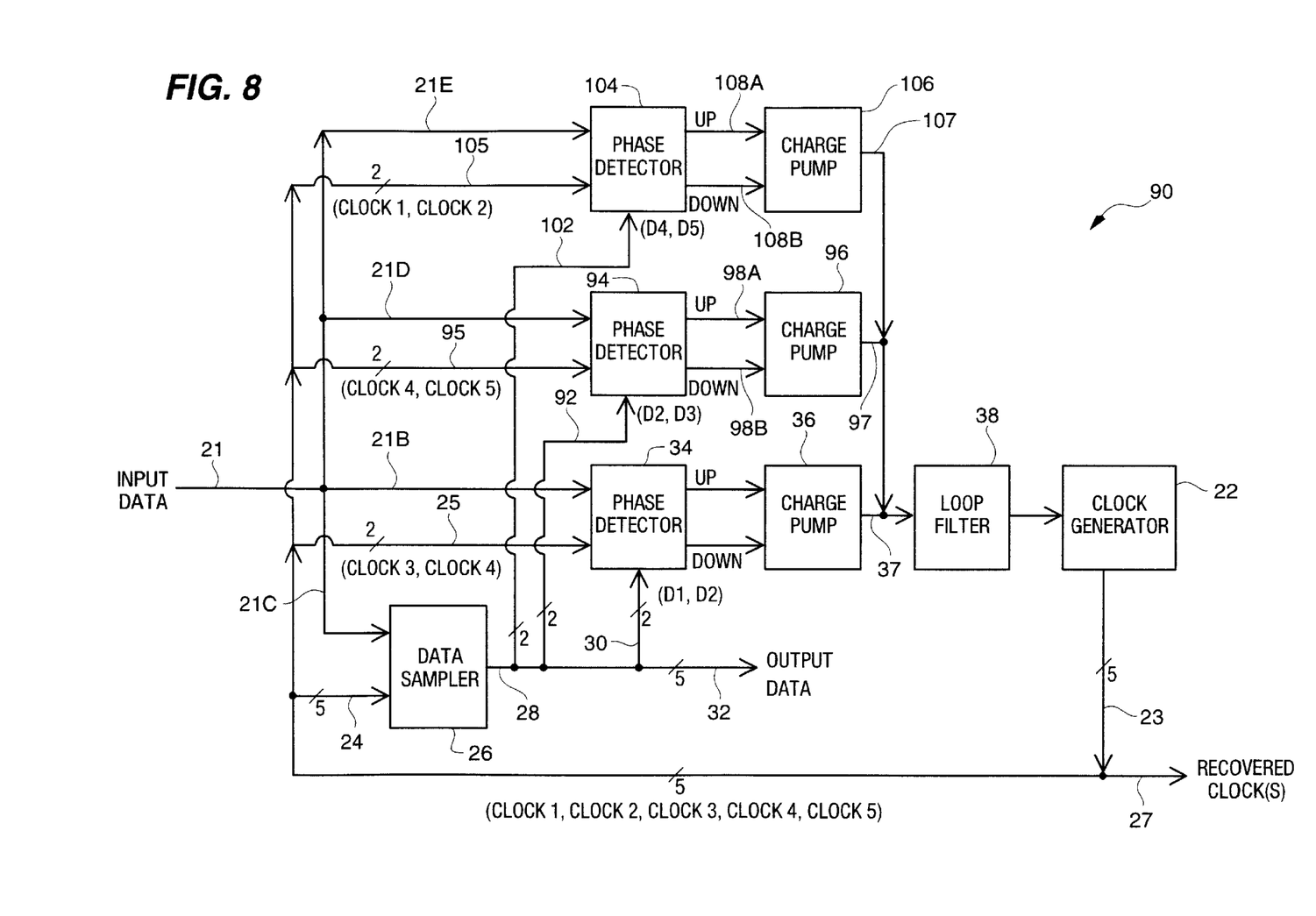
FIG. 8 is a schematic illustrating a preferred implementation of the invention having three phase detectors in parallel, all feeding into a loop filter for phase correction.

Note that phase adjustment is done in coordination with the length of a clock cycle ($T_{clock}$ at 46 in FIG. 3). In the event making phase adjustments every $T_{clock}$ is considered too long relative to the incoming data rate, it may be desirable or necessary to strobe the incoming data more often. FIG. 8 illustrates one implementation of the invention at 90 that includes a second phase detector 94 in series with a second charge pump 96 and a third phase detector 104 in series with a third charge pump 106. The outputs of the three charge pumps 36, 96, 106 are input into loop filter 38 (along 37, 97, 107) to adjust clock generator 22 more frequently. Just as two clocks (CLOCK3 and a reference CLOCK4) are input via 25 into phase detector 34, two clocks (CLOCK4 and a reference CLOCK5 which is strobed for alignment with incoming data 21d) can be input via 95 into phase detector 94. Similarly, two clocks (CLOCK1 and a reference CLOCK2 which is strobed for alignment with incoming data 21e) can be input via 105 into phase detector 104. Phase detector 94 uses two clocked outputs (D2, D3 along 92) and phase detector 104 uses clocked outputs (D4, D5 along 102). "Up" 98a and "down" 98b adjustment outputs from phase detector 94 will feed into charge pump 96. Likewise, "up" 108a and "down" 108b adjustment outputs from phase detector 104 will feed into charge pump 106.

Based upon the desired or required frequency of phase adjustments to a PLL clock generator, a circuit can be fabricated to strobe, in between the rising edges of two adjacent clocks, each of the generated phase-shifted clocks for alignment with incoming data 21. One could build such a circuit with five parallel phase detectors (corresponding to the five phase-shifted clocks generated in this example) using CMOS technology.

By way of additional examples, CMOS technology could be used to implement the new method and PLL circuits of the invention using a clock generator having, theoretically, any number of stages for producing any number of phase-shifted clocks. A three-stage clock generator is built for data incoming at a rate of 1-Gb/sec would have to operate at 333.33 MHZ (or ⅓ times 1-Gb/sec). Likewise, a seven-stage clock generator built to recover data, also incoming at a rate of 1-Gb/sec, would need to operate at 142.86 MHZ, and so on. The data sampler for a three-stage VCO would include three incoming bit sampling devices. A data sampler for a seven-stage VCO would use seven incoming bit sampling devices, and so on. In any case, two adjacent clocked outputs could be input into a phase detector along with a reference clock and the incoming data for phase adjustment of the clock generator in accordance with principles discussed herein.

While certain representative embodiments and details have been shown for the purpose of illustrating the invention, those skilled in the art will readily appreciate that various modifications may be made to the invention without departing from the novel teachings or scope of this invention. Accordingly, all such modifications are intended to be included within the scope of this invention as defined in the following claims. In the claims, any means-plus-function clauses used are intended to cover the structures described herein as performing the recited function and not only structural equivalents but also equivalent structures (an example of the latter being a nail and screw in the environment of fastening parts).

What is claimed is:

1. A circuit for detecting whether a reference clock signal, one of n phase-shifted adjacent clock signals, of a phase-locked loop (PLL) is aligned with incoming data, comprising:

a data sampler for sampling bits of the incoming data with each of the adjacent clock signals, wherein a first of the adjacent clock signals clocks said bits 0, 0+n, 0+2n, . . . , and a second of the adjacent clock signals clocks said bits 1, 1+n, 1+2n, . . . , where n is an odd integer.

2. The circuit of claim 1 further comprising a first pair of outputs from said sampler having been produced from two of the adjacent clock signals for use in a first phase detector along with the reference clock signal and the incoming data.

3. A circuit for detecting whether a reference clock signal, one of n phase-shifted adjacent clock signals, of a phase-locked loop (PLL) is aligned with incoming data, comprising:

a data sampler for sampling bits of the incoming data with each of the adjacent clock signals, wherein a first of the adjacent clock signals clocks said bits 0, 0+n, 0+2n, . . . , and a second of the adjacent clock signals clocks said bits 1, 1+n, 1+2n, . . . ; and a first pair of outputs from said sampler having been produced from two of the adjacent clock signals for use in a first phase detector.

4. The circuit of claim 3 wherein said first phase detector is capable of producing a phase adjustment output for a charge pump connected in series with a clock generator having generated the adjacent clock signals to operate at a trimmed frequency close to 1/n times the incoming data frequency.

5. A circuit for detecting whether a reference clock signal, one of n phase-shifted adjacent clock signals, of a phase-locked loop (PLL) is aligned with incoming data, comprising:

a data sampler for sampling bits of the incoming data with each of the adjacent clock signals, wherein a first of the adjacent clock signals clocks said bits 0, 0+n; 0+2n, . . . , and a second of the adjacent clock signals clocks said bits 1, 1+n, 1+2n, . . . , wherein a pair of the adjacent clock signals, one of which is the reference clock, is used in a first phase detector; and said first phase detector further comprises a logic-AND device for operating on a first pair of outputs from said sampler, one of which having been inverted, and a first latch for sampling the reference clock with the incoming data.

6. The circuit of claim 5 wherein said first phase detector further comprises:

first and second flip-flops, each of which operates with an output of said logic-AND device, an output of said first latch, and the other of said pair of adjacent clock signals; and second and third latches, each for sampling an output of each said flip-flop with the reference clock; said second and third latches for producing a phase adjustment output.

7. A circuit for detecting whether a reference clock signal, one of n phase-shifted adjacent clock signals, of a phase-locked loop (PLL) is aligned with incoming data, comprising:

a data sampler for sampling bits of the incoming data with each of the adjacent clock signals, wherein a first of the adjacent clock signals clocks said bits 0, 0+n, 0+2n, . . . , and a second of the adjacent clock signals clocks said bits 1, 1+n, 1+2n, . . . , wherein a phase adjustment output of the circuit is for a current-type charge pump connected in series with a loop filter and an n-stage voltage-controlled oscillator (VCO) having generated the adjacent clock signals; and a second phase detector in series with a second charge pump, both of which are connected in parallel with a first phase detector and said current-type charge pump, wherein a second pair of outputs from said sampler, at least one of said second pair different from said first pair of outputs, is used in said second phase detector along with a second reference clock signal of the adjacent clock signals and the incoming data.

8. A circuit for detecting whether a reference clock signal, one of n phase-shifted adjacent clock signals, of a phase-locked loop (PLL) is aligned with incoming data, comprising:

a data sampler for sampling bits of the incoming data with each of the adjacent clock signals, wherein a first of the adjacent clock signals clocks said bits 0, 0+n, 0+2n, . . . , and a second of the adjacent clock signals clocks said bits 1, 1+n, 1+2n, . . . , wherein:

a phase adjustment output of the circuit is for a charge pump connected in series with an n=5-stage voltage-controlled oscillator (VCO) having generated the adjacent clock signals; and a third of the adjacent clock signals clocks said bits 2, 2+n, 2+2n, . . . , a fourth of the adjacent clock signals clocks said bits 3, 3+n, 3+2n, . . . , and a fifth of the adjacent clock signals clocks said bits 4, 4+n, 4+2n, . . . .

9. The circuit of claim 8:

wherein said charge pump is a voltage-type charge pump connected in series with a low-pass loop filter and said VCO; and further comprising a first pair of outputs from said sampler for use in a first phase detector along with the reference clock signal and the incoming data.

10. A phase-locked loop (PLL) circuit for recovering a clock signal from incoming data, comprising:

a clock generator for generating an odd number, n, of phase-shifted adjacent clock signals;

a data sampler for sampling the incoming data; and a first pair of outputs from said sampler for use in a first phase detector along with a reference clock of said adjacent clock signals and the incoming data, said phase detector capable of producing an adjustment output for said clock generator.

11. The PLL circuit of claim 10 wherein:

said clock generator is an n-stage voltage-controlled oscillator (VCO) having generated said adjacent clock signals to operate at a trimmed frequency close to 1/n times the incoming data frequency; and said first phase detector further comprises a logic-AND device for operating on said first pair of outputs, one of which having been inverted, and a first latch for sampling said reference clock with the incoming data.

12. The PLL circuit of claim 10 wherein:

a frequency detector has sufficiently locked-in the PLL circuit to the frequency of said reference clock;

said clock generator is an n-stage voltage-controlled oscillator (VCO);

a first of said adjacent clock signals clocks said bits 0, 0+n, 0+2n, . . . , a second of said adjacent clock signals clocks said bits 1, 1+n, 1+2n, . . . , and a third of said adjacent clock signals clocks said bits 2, 2+n, 2+2n, . . . .

13. The PLL circuit of claim 10 wherein:

said clock generator is an n-stage voltage-controlled oscillator (VCO);

said data sampler comprises n latches; and said first phase detector further comprises: a logic-AND device for operating on said first pair of outputs, one of which having been inverted; a first latch for sampling said reference clock with the incoming data; and first and second flip-flops, each of which operates with an output of said logic-AND device, an output of said first latch, and another of said adjacent clock signals.

14. A method for recovering data in a phase-locked loop (PLL) comprising the steps of:

generating n phase-shifted adjacent clock signals for sampling bits incoming to the PLL; wherein a first of said adjacent clock signals clocks said bits 0, 0+n, 0+2n, . . . , and a second of said adjacent clock signals clocks said bits 1, 1+n, 1+2n, wherein n is an odd number.

15. The method of claim 14 further comprising the step of using a third of said adjacent clock signals to clock said bits 2, 2+n, 2+2n, . . . .

16. The method of claim 15 further comprising the steps of:

said step of generating comprises using an n-stage voltage-controlled oscillator (VCO) operating at a trimmed frequency close to 1/n times the frequency of said bits;

using a fourth of said clock signals to clock said bits 3, 3+*n*, 3+2*n*, . . . , and using a fifth of said clock signals to clock said bits 4, 4+*n*, 4+2*n*, . . . ;

detecting whether a reference clock of said adjacent clock signals is aligned with said bits; and outputting the data from the PLL.

17. The method of claim 14 further comprising the steps of detecting whether a reference clock of said adjacent clock signals is aligned with said bits, and in the event of non-alignment, producing a phase adjustment output to adjust phase of the reference clock.

18. A method for recovering data in a phase-locked loop (PLL) comprising the steps of:

generating n phase-shifted adjacent clock signals for sampling bits incoming to the PLL; wherein a first of said adjacent clock signals clocks said bits 0, 0+*n*, 0+2*n*, and a second of said adjacent clock signals clocks said bits 1, 1+*n*, 1+2*n*, . . . , wherein n is an odd number, said step of generating comprises using an n-stage voltage-controlled oscillator (VCO) operating at a trimmed frequency close to 1/n times the frequency of said bits;

using a third of said adjacent clock signals to clock said bits 2, 2+*n*, 2+2*n*, . . . ;

using a fourth of said clock signals to clock said bits 3, 3+*n*, 3+2*n*, . . . , and using a fifth of said clock signals to clock said bits 4, 4+*n*, 4+2*n*, . . . ;

detecting whether a reference clock of said adjacent clock signals is aligned with said bits, wherein said step of detecting further comprises the steps of:

operating, using a logic-AND device, on a first pair of said sampled outputs, one of which having first been inverted;

sampling said reference clock with said bits for input into each of a first and second flip-flop; and sampling an output of each of said first and second flip-flops with said reference clock to produce any requisite phase adjustment output; and outputting the data from the PLL.

19. A method for recovering data in a phase-locked loop (PLL) comprising the steps of:

generating n phase-shifted adjacent clock signals for sampling bits incoming to the PLL; wherein a first of said adjacent clock signals clocks said bits 0, 0+*n*, 0+2*n*, . . . , and a second of said adjacent clock signals clocks said bits 1, 1+*n*, 1+2*n*, . . . ;

detecting whether a reference clock of said adjacent clock signals is aligned with said bits, and in the event of non-alignment, producing a phase adjustment output to adjust phase of the reference clock, wherein said step of detecting further comprises the steps of using a first pair of said sampled outputs, a reference clock of said adjacent clock signals, and said bits to produce said phase adjustment output; and making any requisite phase adjustments to the PLL.

20. The method of claim 19 further comprising the step of detecting whether a second reference clock of said adjacent clock signals is aligned with said bits, and in the event of non-alignment, producing a second phase adjustment output to make any second requisite phase adjustment to the PLL.

21. A circuit for detecting whether a reference clock signal, one of n phase-shifted adjacent clock signals, of a phase-locked loop (PLL) is aligned with incoming data, comprising:

a first pair of clocked outputs from a data sampler for use in a first phase detector along with the reference clock signal; and a second pair of clocked outputs from said sampler, at least one of said second pair different from said first pair, used in a second phase detector along with a second reference clock signal of the adjacent clock signals.

22. The circuit of claim 21 wherein:

said first phase detector is capable of producing a first phase adjustment output for a first charge pump in series therewith;

said second phase detector is capable of producing a second phase adjustment output for a second charge pump in series therewith; and said phase adjustment outputs are for a clock generator of the adjacent clock signals.

23. The circuit of claim 21 wherein said first phase detector further comprises a logic-AND device for operating on said first pair of clocked outputs, one of which having been inverted, and a first latch for sampling the reference clock with the incoming data.

24. The circuit of claim 21 further comprising a third pair of clocked outputs from said sampler, at least one of said third pair different from said second pair, is used in a third phase detector along with a third reference clock signal of the adjacent clock signals and the incoming data.

25. The circuit of claim 24 wherein said third phase detector is capable of producing a third phase adjustment output for a third charge pump in series with a clock generator; said first, second, and third phase detectors connected in parallel.

\* \* \* \* \*